United States Patent [19]
Nagumo

[11] Patent Number: 5,306,167
[45] Date of Patent: Apr. 26, 1994

[54] IC SOCKET

[75] Inventor: Takayuki Nagumo, Sagamihara, Japan

[73] Assignee: Minnesota Mining and Manufacturing Company, St. Paul, Minn.

[21] Appl. No.: 71,584

[22] Filed: Jun. 2, 1993

[30] Foreign Application Priority Data

Jun. 2, 1992 [JP] Japan .................. 4-141227

[51] Int. Cl.⁵ .................................. H01R 9/09
[52] U.S. Cl. ........................ 439/226; 439/70; 439/331
[58] Field of Search ............ 439/70, 72, 73, 264, 439/266, 267, 269, 331, 352, 159

[56] References Cited

U.S. PATENT DOCUMENTS

| | | | |
|---|---|---|---|
| 4,563,552 | 1/1986 | Fushimoto | 439/331 X |
| 4,616,895 | 10/1986 | Yoshizaki et al. | 439/72 X |
| 4,623,208 | 11/1986 | Kerul et al. | 339/74 |
| 4,678,255 | 7/1987 | Carter | 439/267 |
| 4,715,823 | 12/1987 | Exera et al. | 439/267 |
| 4,824,392 | 4/1989 | Billman et al. | 439/331 |
| 4,846,703 | 7/1989 | Matsuoka et al. | 439/71 |
| 4,886,470 | 12/1989 | Billman et al. | 439/266 |
| 4,984,991 | 1/1991 | Nishimoto | 439/72 |
| 4,984,997 | 1/1991 | Korsunsky et al. | 439/331 |
| 5,073,116 | 12/1991 | Beck, Jr. | 439/331 |
| 5,076,798 | 12/1991 | Uratsuji | 439/269 |
| 5,154,620 | 10/1992 | Martucci et al. | 439/73 |

FOREIGN PATENT DOCUMENTS

| | | | |
|---|---|---|---|
| 0780162 | 4/1935 | France | 439/226 |
| 64-65782 | 3/1989 | Japan . | |

Primary Examiner—Z. R. Bilinsky
Attorney, Agent, or Firm—Gary L. Griswold; Walter N. Kirn; John C. Barnes

[57] ABSTRACT

The present invention relates to an IC socket to be used for testing various IC packages, an object of which is to provide the IC socket with means facilitating insertion and removal of IC packages either in testing by employing an automatic loader or in testing with manual operation. It is constructed to have a socket body formed with a plurality of contacts for establishing electric contact with leads of an IC package, a cover 2 for removably fitting the IC package on the socket body, latches 4 having hooks 42 arranged at least at two diagonally opposing corners of said cover 2, and hooking to said socket body 1, and projections extending in the same direction to the hooks 42, releasing blocks 5 arranged in the vicinity of said latches and movable in the vertical direction with respect to said projection 43, and catching portions 11 formed in said socket body 1 and to be hooked the hook 42 of said latch 4.

5 Claims, 11 Drawing Sheets

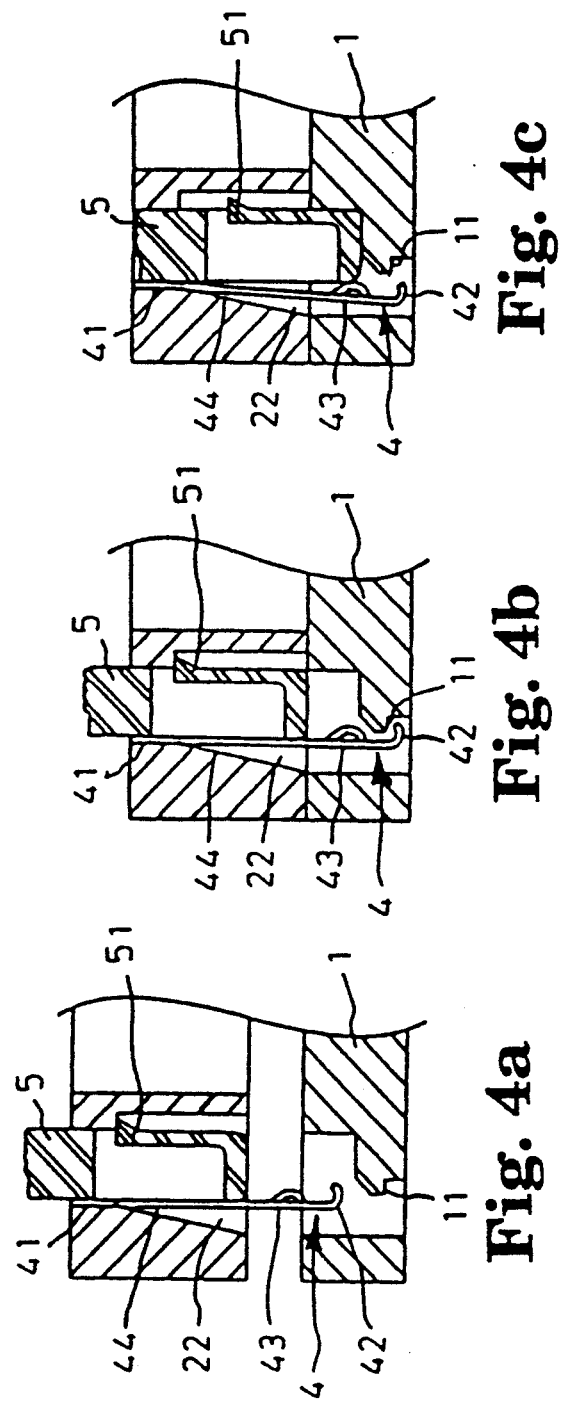

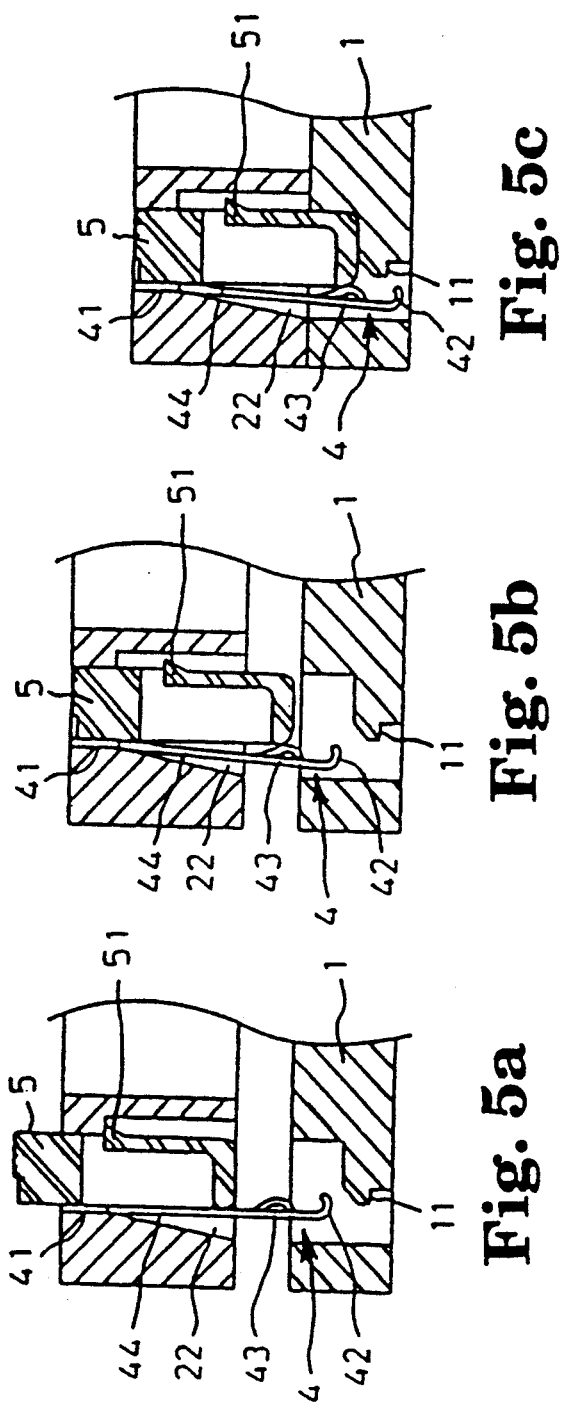

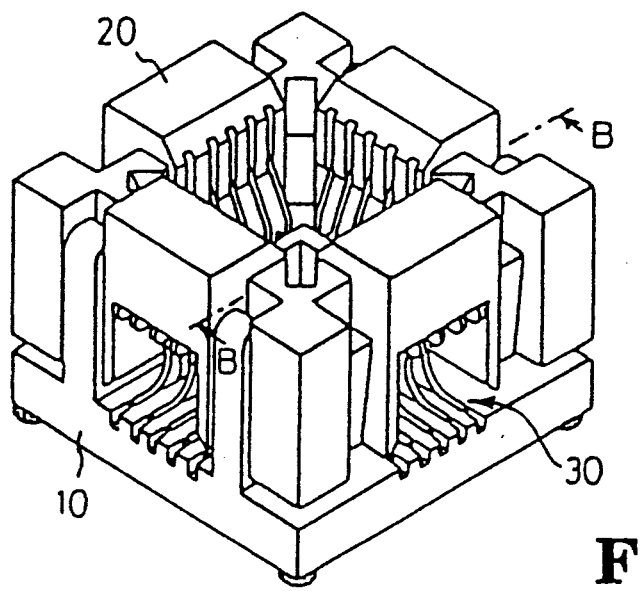
Fig. 7
PRIOR ART
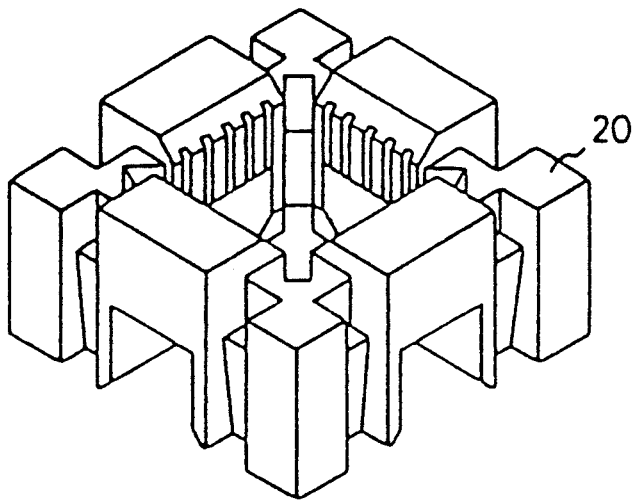
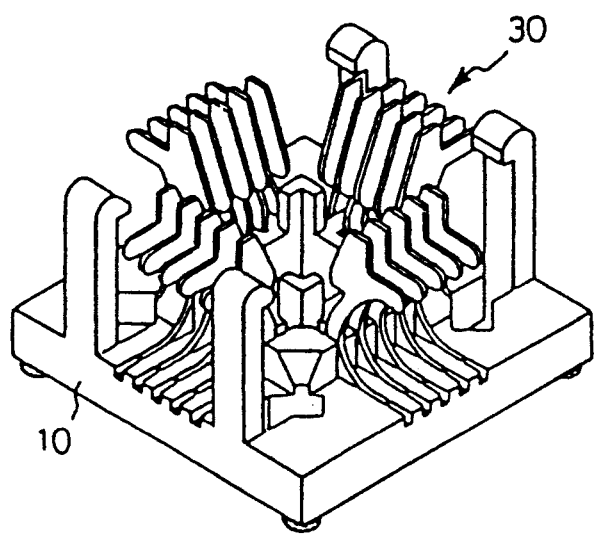
Fig. 8
PRIOR ART

IC SOCKET

BACKGROUND OF THE INVENTION

1. Field of the Invention

The present in invention relates to an IC socket used for the testing of various IC packages, such as QFP (Quad Flat Package), SOP (Small Outline Package) and so forth.

Typically, IC packages are tested in some manner to ensure their proper functions. The present invention relates to the IC socket which enable various tests for a plurality of IC packages quickly and certainly.

2. Description of Prior Art

One of the tests for IC packages is the burn-in test, in which the IC package is inserted into the IC socket and thereafter installed within a convection oven for testing high-temperature characteristics of the IC package under an elevated temperature.

As to the IC socket to be used for the above-mentioned bur-in test, there are some applications in which the IC sockets adapted to testing by automatic process are disclosed. For example, U.S. Pat. Nos. 4,623,208 and 4,886,470 disclose IC sockets adapted to automated-type testing apparatus.

FIGS. 7 to 9 show the conventional IC socket disclosed in U.S. Pat. No. 4,623,208. In further detail, FIG. 7 is a perspective view showing normal condition before testing, FIG. 8 is an exploded perspective view showing overall construction, FIG. 9 is a section of the condition, in which the IC package is inserted, taken along line B—B of FIG. 7, and FIG. 10 is a section of the condition, in which the IC package is installed, taken along line B—B of FIG. 7.

FIGS. 11 to 13 show the conventional IC socket disclosed in U.S. Pat. No. 4,886,470. In further detail, FIG. 11 is a perspective view in the normal state before testing, FIG. 12 is a section of the condition, in which a lead of the IC package is contacting the contact, taken along line C—C of FIG. 11, and FIG. 13 is a section of the condition, in which a lead of the IC package is held in non-contact with the contact, taken along line C—C of FIG. 11.

As illustrated, the above-mentioned two kinds of IC sockets comprise socket bodies 10, covers 20 and a plurality of contacts 30. Each of the contacts 30 has a contact section 40 for electrical contact with the lead L of the IC package P (strictly speaking, a pad of a chip carrier corresponds to the lead in the first prior art example FIGS. 7 to 10), a cantilever section 50 for rotating the contact section, 40 to enable connection and releasing between the lead L and each contact 30.

Here, when the cover 20 is depressed downwardly against a resilient force (reacting force) of the contact 30, the above-mentioned contact 30 is forcingly displaced outwardly to place the contact 30 and the lead L of the IC package P into the non-contacting state to release connection therebetween. Accordingly, in this condition, insertion and removal (loading and unloading) of the IC package P can be performed. When depression force on the cover 20 is removed, the contact 30 is rotated in the reverse direction to restore connection with the lead L of the IC package P.

However, the above-mentioned IC socket does not have an operation stand-by mechanism. Therefore, particularly when the test for the IC package is performed by manual operation, loading and unloading od the IC package has to be done by downwardly depressing the cover 20 against the reacting force of the contacts, making the operation very difficult. In order to solve this problem, an IC socket provided with an operation stand-by mechanism of the cover has been disclosed in Unexamined Patent Publication (Kokai) No. 64-65782, for example.

FIGS. 14 to 17 are illustrations showing the prior art in Unexamined Patent Publication No. 64-65782. In further detail, FIG. 14 is a perspective view showing overall construction of the IC socket, FIG. 15 is a perspective view of the IC socket in a condition where the IC socket and the contact are held in a non-contacting state, FIG. 16 is a partial side section of the IC socket in the foregoing condition, and FIG. 17 is a partial side section of the IC socket in a condition where the IC package and the contact are held in a contacting state. It should be noted that the similar construction elements to the foregoing will be represented by the same reference numerals.

As shown, this IC socket enable the establishment of the operation stand-by state by hooking latch 70, formed integrally with the socket body 10, to projections 80 of the cover. With the above-mentioned IC socket, the cover can be held at the lowermost position. Namely, since the contact 30 can be held in the contact releasing position, it is unnecessary to forcingly depress the cover with an external force for facilitating loading and unloading of the IC package.

PROBLEM TO BE SOLVED BY INVENTION

This IC socket holds four problems:

Firstly, the die construction of the socket body is very complicated.

Secondly, in order to release the operation stand-by state of the cover 20, external forces F (FIG. 17) have to be exerted on both sides to make the construction of the automatic loader complicated.

Thirdly, when the number of contacts is increased, a reacting force of the contact for pushing the cover upwardly is increased so as to cause lack of strength of the molded latch 70 for resistance against the reacting force.

Fourthly, though this IC socket is suitable for manual operation, when an automatic loader of the type in which depression of the cover 20 and insertion and removal of the IC package P are performed simultaneously, operation stand-by state releasing action is required separately from depression of the cover 20 since the cover is placed into the operation stand-by state at the lower-most position. Therefore, the automatic loader requires two actions in insertion and removal of the IC package.

Accordingly, none of the above-mentioned three prior arts can provide an IC socket which can perform both the manual and automatic operations simply.

The present invention is established in view of the above-mentioned problems. Therefore, it is an object of the present invention to provide an IC socket which facilitates insertion and removal of IC package either in the testing of the IC package by manual operation or in the testing by employing the automatic loader.

SUMMARY OF THE PRESENTLY PREFERRED INVENTION

According to the present invention, there is provided an IC socket including a socket body formed with a plurality of contacts for electrical contact with leads of an IC package and a cover releasably loading the IC package on the socket body by vertical movement, and further comprising a plurality of latches arranged at least at two diagonally opposing corners of the cover, each latch having a nail or shank with a hook at the end for hooking to the socket body and having projections extending in the same direction to the nails, a plurality of releasing blocks arranged in the vicinity of the latches and movable in a direction perpendicular with respect to the projection, and a plurality of catching portions formed in the socket body to be hooked by the hook of the latch. Further, in the IC socket, when the cover is depressed, the nail hooks to the catching portion to maintain the cover at a predetermined position of the socket, and when the releasing blocks are depressed, the lower end of the releasing block slidingly contacts the projection so that the projections are depressed toward the opposite side to the projections and hooks, and the engaging state between the nails and the catching portions is released.

Further, the latch is preferably, made of a resilient member, and is provided with a cantilever portion.

In addition, the cover preferably, has a receptacle cavity for receiving the latch and the releasing block.

In the IC socket according to the present invention, when only the cover is depressed without depressing the release block as in the case of testing the IC package by manual operation, and so forth, the nail hooks to the catching portion to hold the cover at the predetermined position (lowermost position, for example) in the socket body thus placing it at the operation stand-by state. In this condition, since the contact can be held retracted without requiring force to depress the cover, it facilitates insertion and removal of the IC package. Furthermore, by depressing only the releasing block, the lower end of the release block slidingly contacts the latch to retract the projection in the direction opposite to the hook, releasing the hooking state between the nail and the catching portion. Namely, the operation stand-by state can be easily released.

On the other hand, in the case of the automatic loader, when the overall upper surface of the cover is depressed together with the releasing block on a flat surface, since the releasing block is depressed in advance of depression of the cover, the latch can be held in a latch-releasing state from the beginning, and the operation stand-by state is not established even when the cover reaches the lowermost position of the socket body. Accordingly, in this case, it does not require latch releasing action. Therefore, testing of the IC package by the operation of the automatic loader is facilitated.

Therefore, according to the present invention, since the latches and the release blocks are formed at the corners of the cover of the IC socket and further operation stand-by function is provided for the cover by actuating the latch upon the manual operation, and the latches are placed at the latch releasing position from the beginning by actuating the releasing block upon the operation by the automatic loader, it becomes possible to provide the IC socket which facilitates insertion and removal of the IC package in either case of testing of the IC package by manual operation or of testing thereof by the operation of the automatic loader.

DETAILED DESCRIPTION OF THE DRAWING

Figure 1:
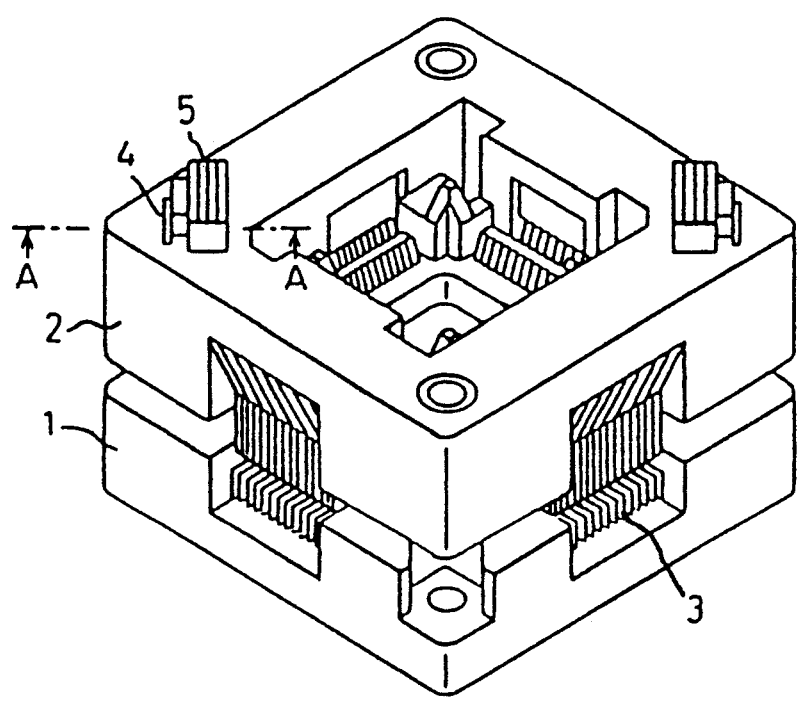
FIG. 1 is a perspective view of an IC socket according to the present invention in a normal state before testing.
Figure 3E:
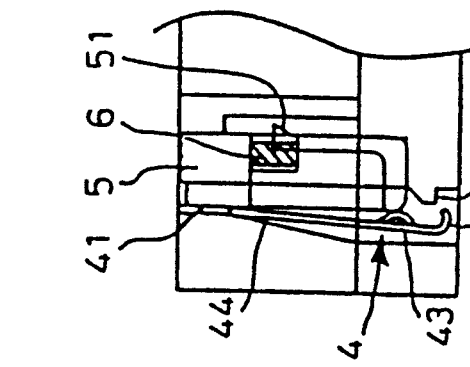
Figure 3D:
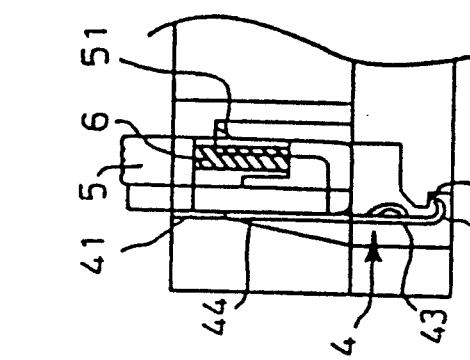
Figure 3C:
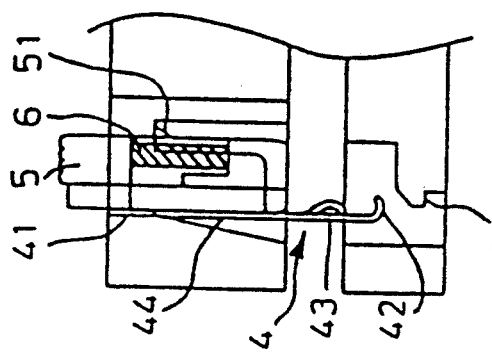
Figure 3A:
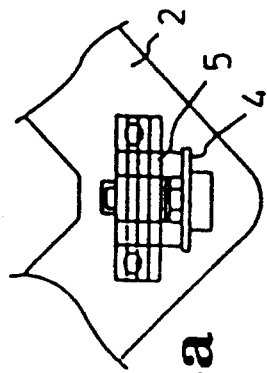
Figure 3B:
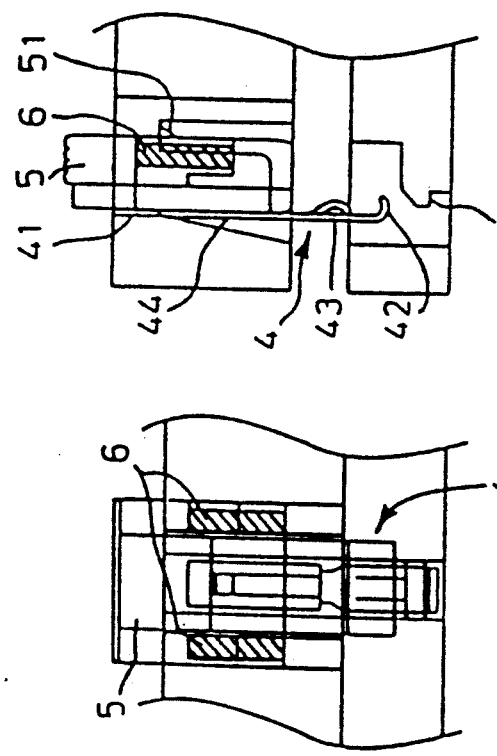
Figure 6:
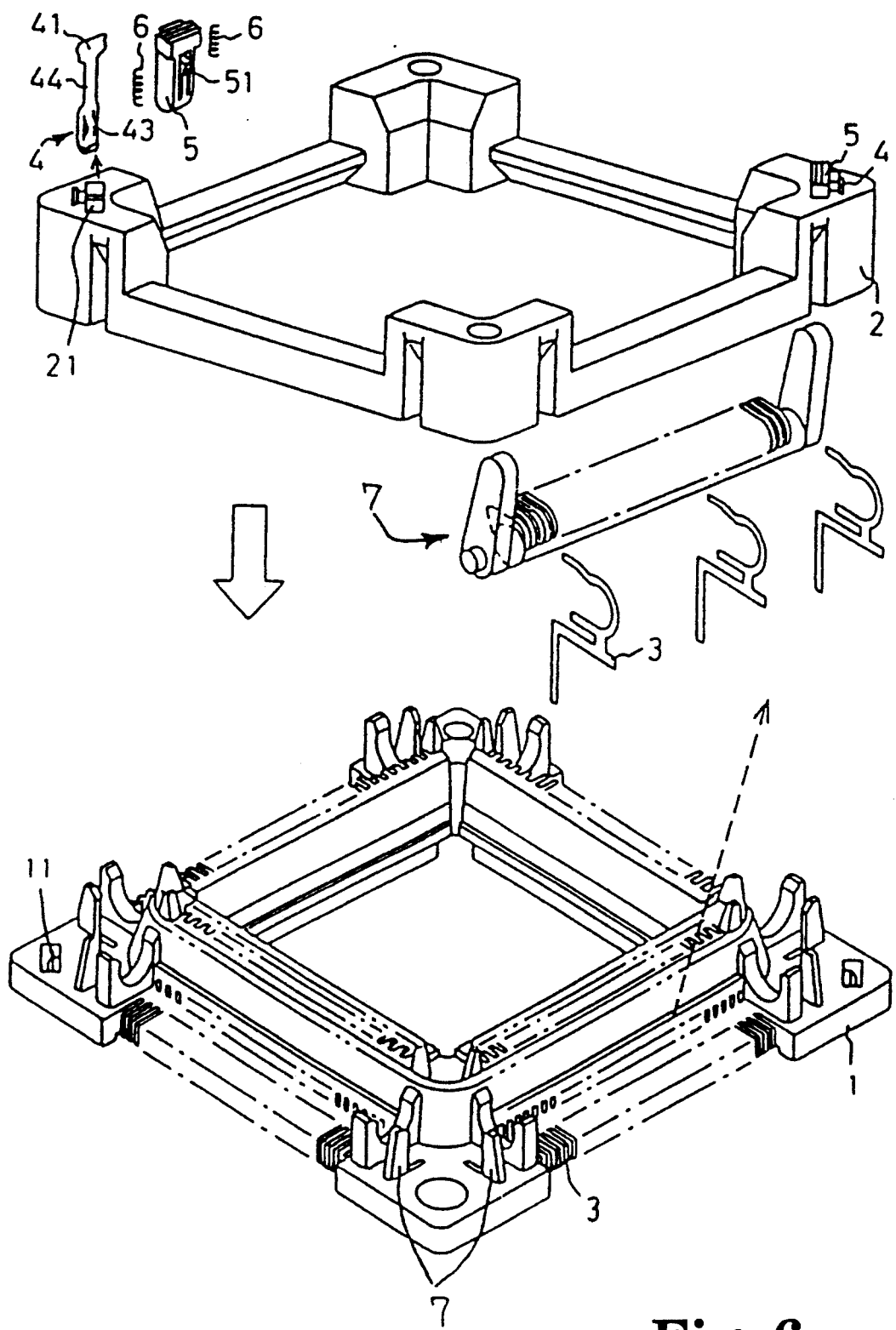
Figure 9:
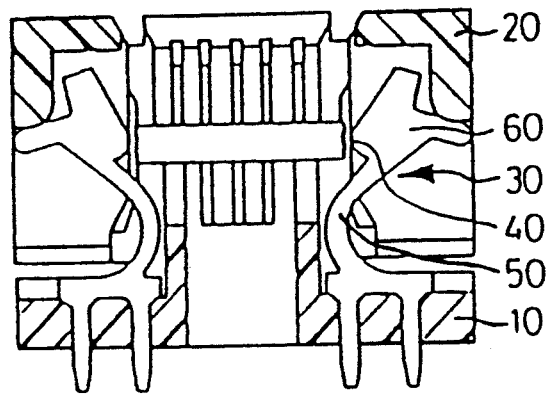
Figure 10:
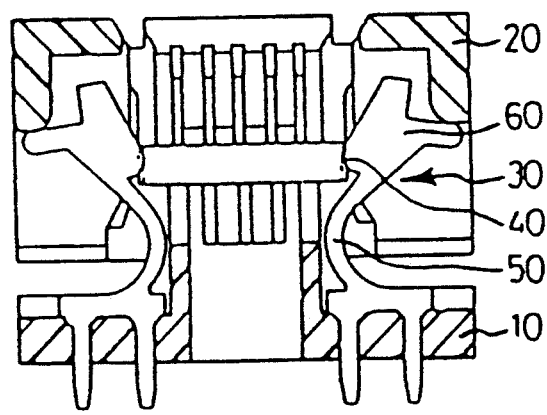
Figure 11:
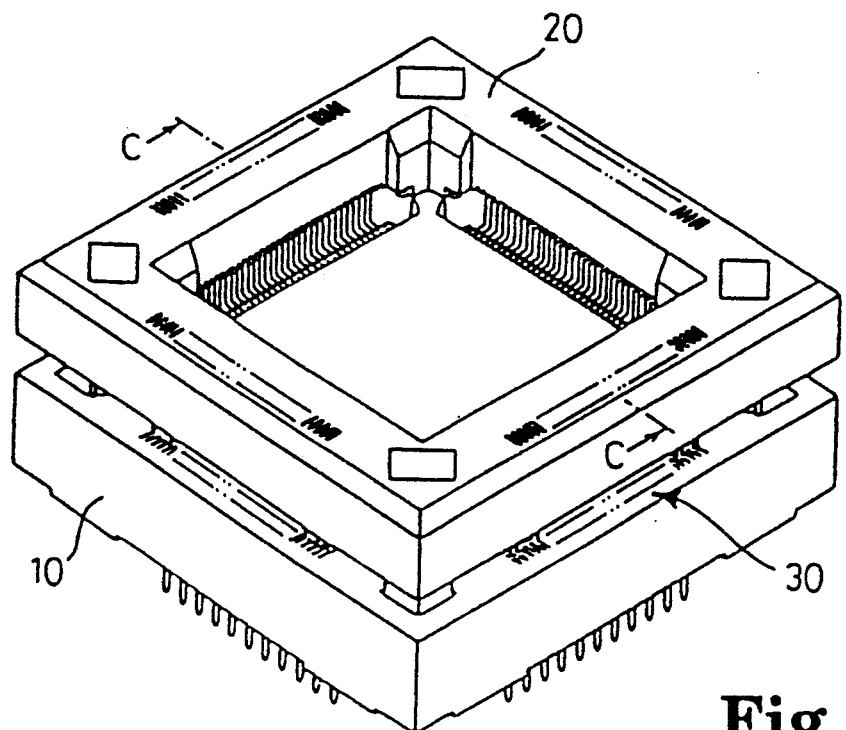
Figure 12:
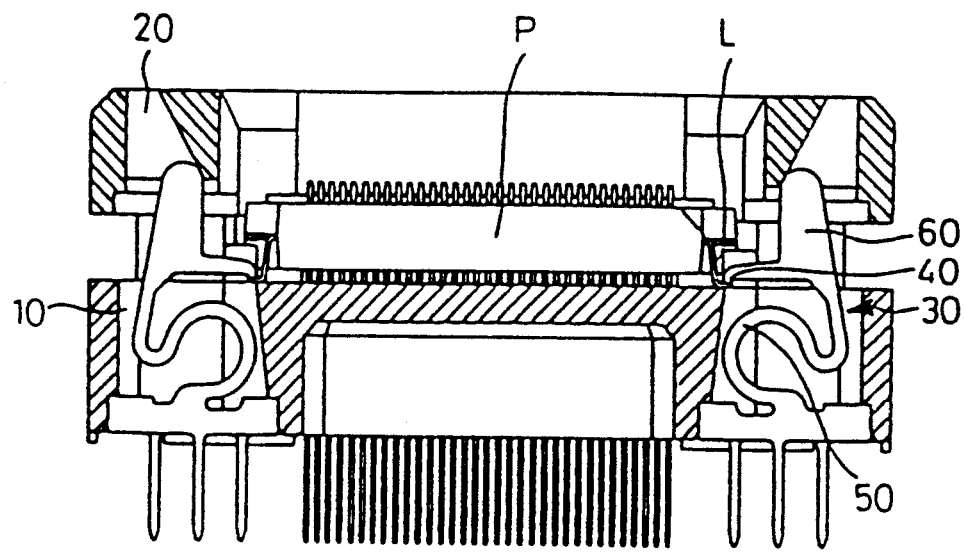
Figure 13:
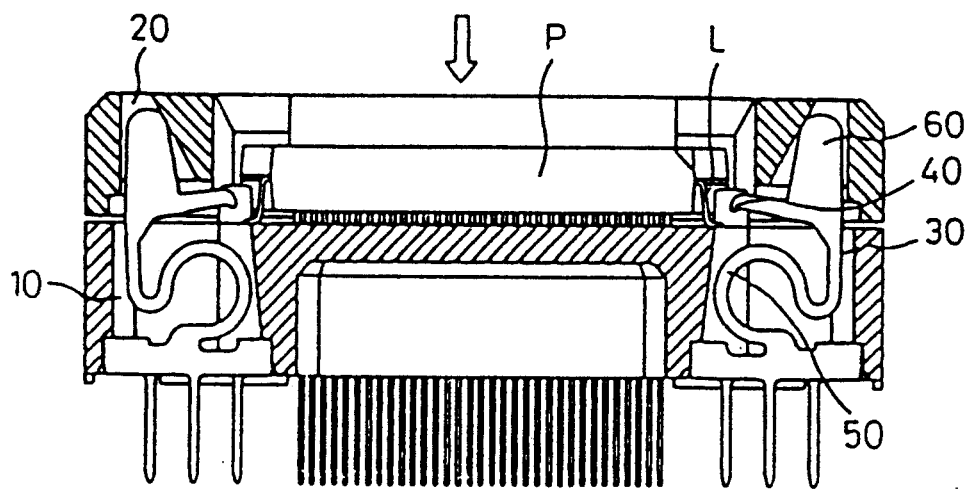
Figure 14:
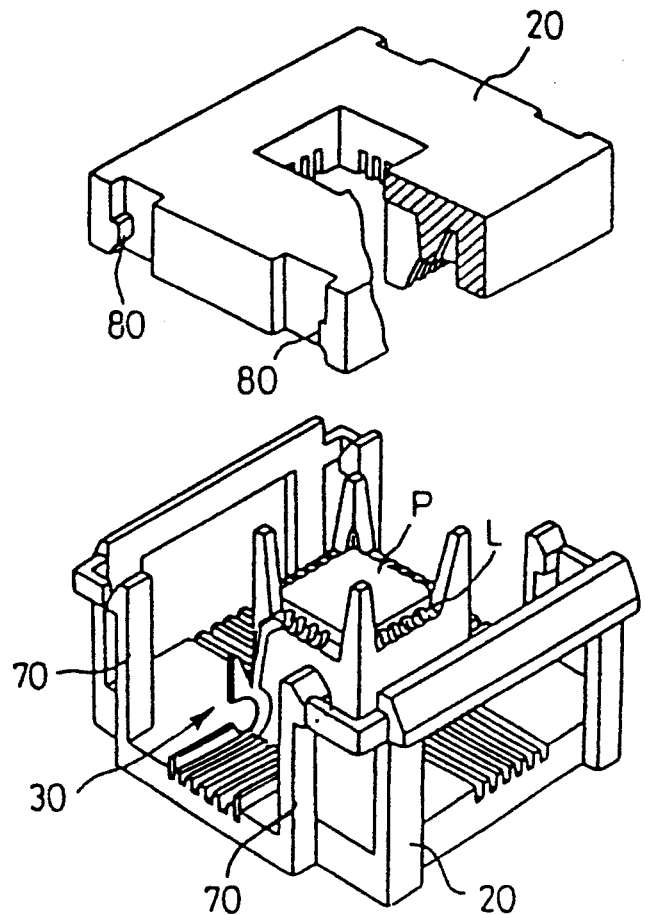
Figure 15:
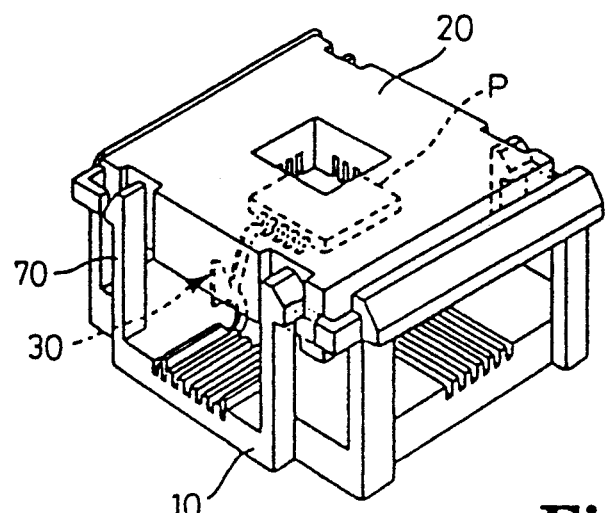
Figure 16:
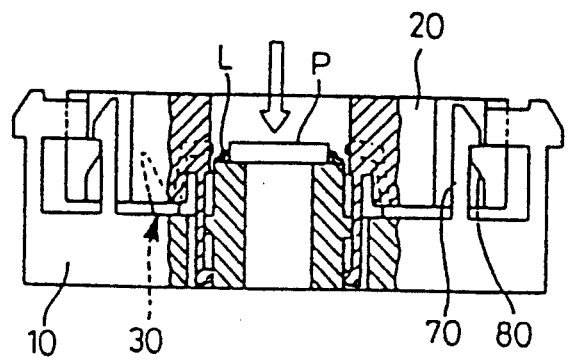
Figure 17:
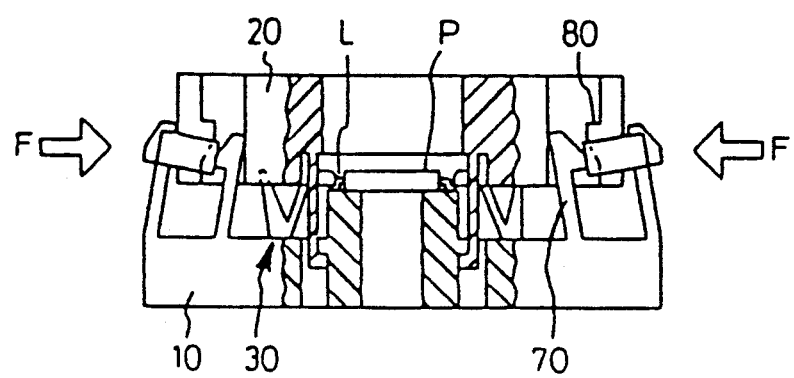

FIG. 3(a) is a detail plan view of one corner of the cover, 3(b) is a vertical sectional view of the latch and cover of FIG. 3(a), 3(c) is a cross sectional view taken along line A—A of FIG. 1 of the latch at the corner of the cover and body with the latch in the open position, 3(d) is a cross sectional view the latch latched to the body, 3(e) is a cross sectional view showing the releasing block moved to the releasing position;

FIG. 4(a) is a cross sectional view of the socket in a condition where only a cover is depressed, 4(b) is a cross sectional view of the cover latched to the body, and 4(c) is a cross sectional view of the latch with the release block depressed;

FIG. 5(a) section in a condition where overall upper surface of the cover is depressed, 5(b) and 5(c) is as taken along line A—A of FIG. 1;

FIG. 6 is an exploded perspective view showing another embodiment of the IC socket according to the present invention;

FIG. 7 is a perspective view of the conventional IC socket disclosed in U.S. Pat. No. 4,623,208 in the normal state before testing;

FIG. 8 is an exploded perspective view showing the overall construction of the conventional IC socket of U.S. Pat. No. 4,523,208;

FIG. 9 is a cross sectional view of a prior art IC socket of U.S. Pat. No. 4,623,208, in a condition where the IC package is inserted, taken along line B—B of FIG. 7;

FIG. 10 is a cross sectional view of a prior art IC socket of U.S. Pat. No. 4,623,208, in a condition where the IC package is loaded, taken along line B—B of FIG. 7;

FIG. 11 is a perspective view of a prior art IC socket disclosed in U.S. Pat. No. 4,886,470, in the normal state before testing;

FIG. 12 is a cross section of the prior art IC socket of U.S. Pat. No. 4,886,470, in a condition where a lead of the IC package is contacting a contact, taken along line C—C of FIG. 11;

FIG. 13 is a cross section of the conventional IC socket of U.S. Pat. No. 4,886,470, in a condition where the lead of the IC package and the contacts are not in contact, taken along lie C—C of FIG. 11;

FIG. 14 is an exploded perspective view showing overall construction of the conventional IC socket of Unexamined Patent Publication No. 64-65782;

FIG. 15 is a perspective view of the IC socket of Unexamined Patent Publication No. 64-65782, in a condition where IC package and the contact are held in a non-contacting state;

FIG. 16 is a partial cross-sectional view of the IC socket of Unexamined Patent Publication No. 64-65782, in a condition where IC package and the contact are held in a non-contacting state; and FIG. 17 is a partial side sectional of the IC socket of Unexamined patent Publication No. 64-65782, in a condition where IC package and the contact are in a contacting state.

DETAILED DESCRIPTION OF THE PRESENTLY PREFERRED EMBODIMENTS

Figure 2:
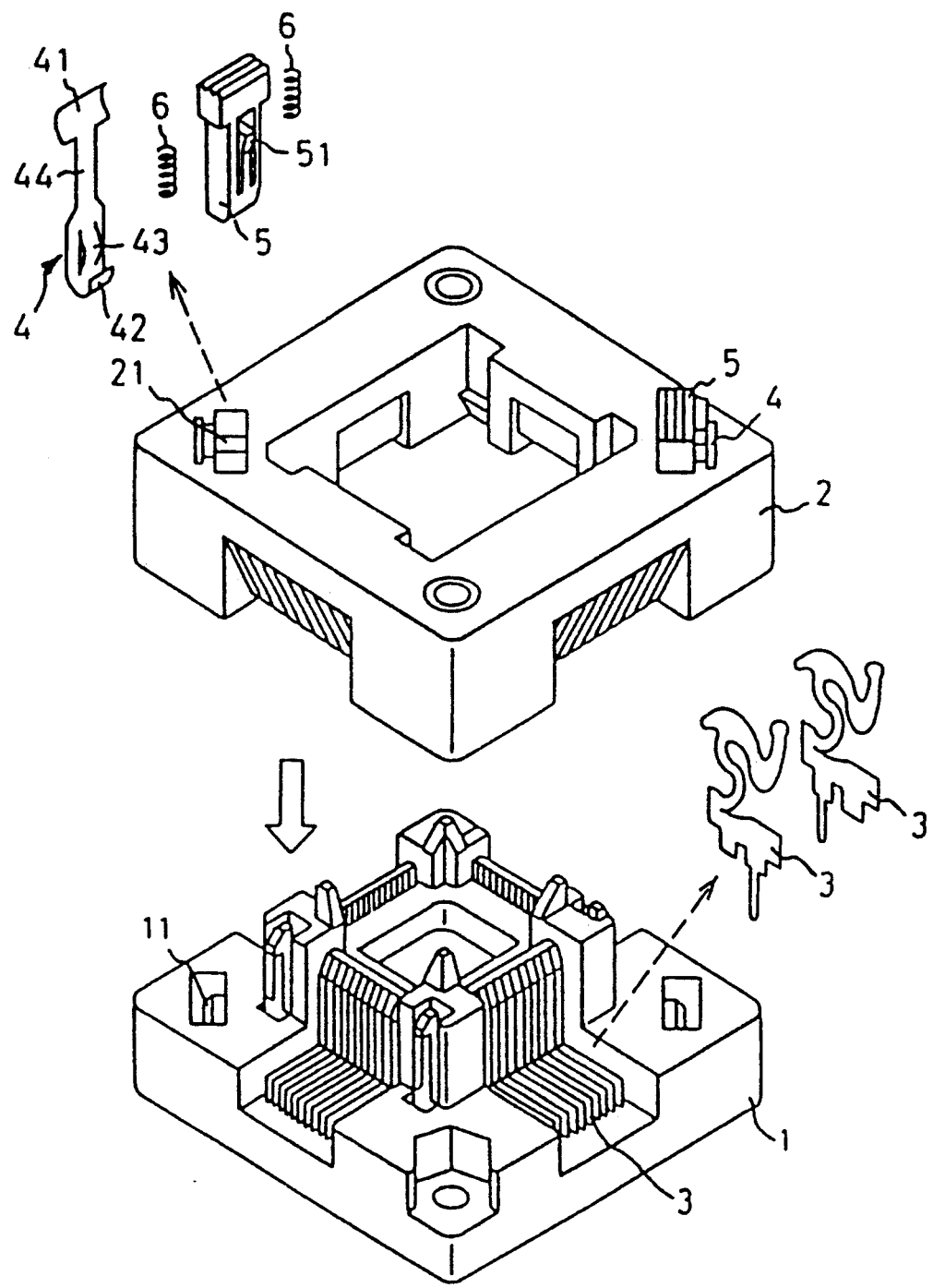
FIG. 2 is an exploded perspective view of the overall construction of the IC socket according to the present invention.

FIGS. 1 to 5 illustrate one embodiment of an IC socket according to the present invention. In further detail, FIG. 1 is a perspective view in the normal state before testing, FIG. 2 is an exploded perspective view showing the overall construction, FIG. 3 is a partial looking-through illustration of a latching function portion illustrating an operation stand-by mechanism, FIG. 4 is a section in a condition where only a cover is depressed, taken along line A—A of FIG. 1 and FIG. 5 is a section in a condition where the overall upper surface of the cover is depressed, taken along line A—A of FIG. 1. It should be noted that these figures omit a package P and a lead L.

In the above-mentioned figures, an IC socket according to the present invention comprises a socket body 1, a cover 2 and a plurality of contacts 3. In addition, a plurality of latches 4 and releasing blocks 5 are provided on the sides of the cover 2.

In this case, the latch 4 is preferably formed of a metallic material having resiliency, such as flat spring material or the like. Furthermore, the latch 4 is provided with a hook 42 (see FIG. 2, for example) at the lower end for hooking with the socket body 1, and a projection 43 located above the latch 42 and extending in the same direction to the latch 42 as the hook 42. Furthermore, the latch 4 has a cantilever portion 44 between a fixing portion 41 for fixing the latch 4 onto the cover 2. With the resilient force of the cantilever portion 44, latching and unlatching between the socket body 1 and the cover 2 are enabled. In addition, for the cover 2, as shown in FIGS. 1 and 2, receptacle cavities for receiving the latches 4 and the releasing blocks 5 are formed at diagonally opposing corners. It should be noted that the receptacle cavities may be formed respectively at four corners of the cover 2.

The latch 4 is fixed in the predetermined position in the receptacle cavity 21 of the cover 2 by press fitting or so forth. In such case, the cover 2 has a sufficient accepting space 22 for enabling the latch to serve as cantilever. Furthermore, the releasing block 5 is disposed movably in the vertical direction within the receptacle cavity 21 and is biased upwardly by means of one or more coil springs 6. It should be noted that the coil spring 6 can be replaced with a leaf spring or so forth as long as it may bias the releasing block upwardly. Furthermore, it is possible to form part of the releasing block 5 into spring configuration so that the releasing block 5 may be biased upwardly by itself. The releasing block 5 has a snap-fitting portion 51, the releasing body can be held at a predetermined position. Furthermore, the socket body 1 is provided with catching portions 11 at positions corresponding to the receptacle cavities 21 of the cover and are positioned to be engaged with the hook 42 of the latch 4 for placing the cover at the operation stand-by state. This catching portion 11 can be formed of highly rigid material, such as metal and so forth, and thus can provide high durability.

In the construction of the embodiment shown in FIG. 3, for example, when the releasing block 5 is depressed against the reacting force of the coil spring 6 (spring portion) in a direction perpendicular to the direction of projection of the projections, the lower cantilevered end of the releasing block 5 slidingly contacts with the projection 43 of the latch 4. The projection 43 is pushed outwardly to cause shifting of the hook 42 of the latch 5 rearwardly. Namely, when the hook 42 of the latch 4 is hooked onto the catching portion 11 of the socket body 1, the latching state can be released with a very simple operation, as set forth above. Namely, in case of testing of the IC package by manual operation, since the hook 42 of the latch 4 engages with the catching portion 11 of the socket body 1 as shown in FIG. 4(b), the cover 2 is held in the operation stand-by state at the lowermost position. In this condition, since the cover 2 is not required to be forcingly depressed by means of a jig or so forth, testing of the IC package with manual operation can easily be done. Such latching condition can be released very simply by depressing the releasing block 5, as shown in FIG. 4(c).

On the other hand, when the testing of the IC package is performed by depressing overall upper surface of the cover 2 on a flat surface by the automatic loader, as shown in FIGS. 5(a) and (b), the releasing block 5 is depressed in advance of depression of the cover 2. Therefore, the hook 42 of the latch 4 is retracted rearwardly to a place impossible to engage with the catching portion 11 from the beginning, so that the cover 2 may not be placed into the operation stand-by state even at the lower most position (FIG. 5(c)). Accordingly, in this case, since the latch releasing action is never required, testing of the IC package with the operation of the automatic loader can be performed continuously.

Furthermore, since the latch 4 is formed of a resilient metallic material, it is difficult to cause deformation through repeated testing, and it can certainly provide sufficient strength corresponding to the reactive force even when the number of the contacts is increased. On the other hand, it provides an advantage in the simplification of the die construction for the socket body.

Further, when the material of the releasing block 5 is selected to be an electrically conductive plastic or metal, it may successfully prevent the IC package from being broken by discharge due to static electricity.

FIG. 6 shows another embodiment of the IC socket according to the present invention, which is differentiated from the foregoing embodiment, in that a cam lever 7 is further provided. Namely, in this embodiment, when the cover is depressed, the cam lever 7 slidingly contacts with the cover 2 so that the cam lever 7 is pivoted outwardly, and slidingly contacts the contact 3 to push the contacting portion of the contact upwardly and outwardly. Other constructions and functions are similar to the former embodiment.

The IC socket according to the present invention is also applicable for various types of ICs other than QFP and SOP, by selecting configurations of the socket body 1 and the cover 2. For example, as typical examples, DIP (Dual Inline Package), SIP (Single Inline Package), ZIP (Zigzag Inline Package), PGA (Pin Grid Array), SOI (Small Outline I-Leaded Package), SOJ (Small Outline J-Leaded Package), SON (Small Outline Non-Leaded Package), QFI (Quad Flat I-Leaded Package) QFJ (Quad Flat J-Leaded Package), QFN (Quad Flat Non-Leaded Package) and so forth.

As set forth above, according to the present invention, the latches and the release blocks are formed at the cover of the IC socket to provide the operation stand-by function for the cover by actuation of the latches in the manual operation, and to place the latches at the latch releasing state from the initial state by actuating the releasing block in the operation employing the automatic loader. Therefore, since the IC socket which facilitates insertion and removal of the IC package either in testing of the IC package with manual operation or testing with operation by the automatic loader, a large number of IC packages can be effectively tested.

I claim:

1. An IC socket including a socket body formed with a plurality of contacts for electrical contact with leads of an IC package, and, a cover releasably loading a said IC package on said socket body by vertical movement, wherein said IC socket further comprises a plurality of latches having hooks arranged at least at two diagonally opposing corners of said cover and connected to said socket body and said hooks having projections extending in the same direction as said hooks;

a plurality of releasing blocks arranged in the vicinity of said latches and movable in a direction parallel with respect to the latch; and a plurality of catching portions formed in said socket body for engagement with said hook of said latches, and in which when said cover is depressed, said hook hooks to the catching portion to maintain said cover at a predetermined position in relationship to said socket, and when said releasing blocks are depressed, the lower end of said releasing block slidingly contacts with said projection so that said projections are depressed in a direction opposite that of said hooks and said hooks are released from said catching portions.

2. An IC socket as set forth in claim 1, wherein each said latch is made of a resilient material, and has a cantilever portion between a seating portion and said hook.

3. An IC socket as set forth in claim 1, wherein said cover has a receptacle cavity for receiving said latch and said releasing block, said latch being press fitted to the predetermined position of said receptacle cavity, and said releasing block being mounted in said receptacle opening in a vertically movable position and urged in an upward direction by means of a spring.

4. An IC socket as set forth in claim 2, wherein said cover has a receptacle cavity for receiving said latch and said releasing block, the seating portion of said latch is press fit to the predetermined position of said receptacle cavity, and said releasing block is mounted in said receptacle opening in a vertically movable position and urged in an upward direction by a spring portion.

5. An IC socket as set forth in claim 1, wherein said releasing block is slidably mounted in a cavity and has a cantilevered portion positioned for engagement with said projection.

* * * * *

UNITED STATES PATENT AND TRADEMARK OFFICE
CERTIFICATE OF CORRECTION

PATENT NO. : 5,306,167

DATED : April 26, 1994

INVENTOR(S) : Takayuki Nagumo

It is certified that error appears in the above-indentified patent and that said Letters Patent is hereby corrected as shown below:

On the title page item [30], "4-141227" should read -- 4-141277 --.

Column 1, Line 21, "tioned bur-in test" should read -- tioned burn-in test --.

Column 1, Line 67, "unloading od the" should read -- unloading of the --.

Column 4, Line 28, "U.S. Pat. No. 4,523,208" should read -- U.S. Pat. No. 4,623,208 --.

Signed and Sealed this

Fourth Day of April, 1995

Attest:

BRUCE LEHMAN

*Attesting Officer*    *Commissioner of Patents and Trademarks*